(12) United States Patent
Marinissen et al.

(10) Patent No.: US 6,330,698 B1
(45) Date of Patent: *Dec. 11, 2001

(54) METHOD FOR MAKING A DIGITAL CIRCUIT TESTABLE VIA SCAN TEST

(75) Inventors: Erik J. Marinissen; Marinus C. M. Muijen, both of Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,942

(22) Filed: Apr. 20, 1998

(30) Foreign Application Priority Data

Apr. 24, 1997 (EP) .................................................. 97201224

(51) Int. Cl.[7] .......................... G01R 31/28; G01R 31/317
(52) U.S. Cl. .............................................................. 714/726
(58) Field of Search ................... 714/726–731, 714/741; 326/16

(56) References Cited

U.S. PATENT DOCUMENTS

| | | | | |
|---|---|---|---|---|
| 5,043,986 | * | 8/1991 | Agrawal et al. | 714/736 |
| 5,349,587 | * | 9/1994 | Nadeau-Dostie et al. | 714/726 |
| 5,450,414 | * | 9/1995 | Lin | 714/727 |
| 5,502,730 | * | 3/1996 | Roy et al. | 714/726 |
| 5,627,841 | * | 5/1997 | Nakamura | 714/726 |
| 6,059,451 | * | 5/2000 | Scott et al. | 714/727 |

FOREIGN PATENT DOCUMENTS

2218816 * 11/1989 (GB) .

OTHER PUBLICATIONS

"The Ballast Methodology for Structured Partial Scan Design,", Rajesh Gupta et al, IEEE Trans. Computers, vol. 39, No. 4, Apr. 1990, pp. 538–544.

* cited by examiner

Primary Examiner—Albert Decady
Assistant Examiner—Shelly A Chase
(74) Attorney, Agent, or Firm—Eric M. Bram

(57) ABSTRACT

The method for modifying a representation of a digital circuit (102) in order to allow a scan test comprises a step (106) for selecting a number of the memory elements of the circuit to be made scannable. In this step it is determined whether the circuit comprises a redundant structure. In case of a sequentially redundant structure (200), a memory element (214,216,218,220) of this structure is selected to be made scannable thus providing a pseudo input to the structure and removing the redundancy during scan test. In case of a combinational redundant structure (406), a memory element (404) connecting this structure to another part of the circuit is selected to be made scannable, thus avoiding the propagation of the redundancy of the structure.

12 Claims, 3 Drawing Sheets

METHOD FOR MAKING A DIGITAL CIRCUIT TESTABLE VIA SCAN TEST

BACKGROUND OF THE INVENTION

The invention relates to a method for modifying a representation of a digital circuit in order to allow a scan test, the digital circuit comprising one or more combinational subcircuits and one or more memory elements, the method comprising: a selection step for selecting from the memory elements a number of the memory elements to be made scannable, a replacement step for replacing the selected memory elements by respective scannable memory elements, and a connection step for connecting the scannable memory elements into one or more scan chains.

When testing a circuit, it is determined whether the circuit contains a logical fault resulting from a manufacturing defect. A combinational circuit, this is a circuit that includes no memory elements like flip flops, is tested by applying a number of test patterns to the inputs of the circuit and comparing the observed responses on the outputs of the circuit with expected responses. The test patterns are selected in such a way that a possible logical fault in the circuit will for at least one test pattern result in a response deviating from its expected response. The test patterns and corresponding responses can be generated for a given circuit by a so-called Automatic Test Pattern Generator. If the circuit to be tested includes memory elements it becomes difficult to generate a set of test patterns that covers all possible faults. This is because a response on the outputs of such a circuit does not only depend on the currently applied test pattern on the inputs but also on the current contents of the memory elements. Test patterns for such a circuit are generated by a so-called Sequential Test Pattern Generator. It is generally known that such a generator requires a large computational effort. This problem is solved in the scan test approach by giving the memory elements in addition to their normal functional mode a scan mode. In the scan mode, these scannable memory elements form one or more scan chains connecting to a scan input and scan output of the circuit through which patterns can be shifted into and out of the chain. The scannable memory element can be seen as a pseudo input for the circuit since a desired input value can be applied to the circuit through the memory element. In a similar way, the scannable memory element can be seen as a pseudo output. If for a given circuit all memory elements are substituted by respective scannable memory elements, the resulting circuit can for test purposes be regarded as a combinational circuit. Test patterns covering all logical faults can then be generated for the circuit to be applied to the original, primary inputs and to the scannable memory elements in the same way as for a combinational circuit. A scan test of a circuit includes the following steps:

setting the memory elements into the scan mode, shifting a pattern through the scan chain in such a way that the relevant memory elements receive desired values, setting the memory elements into the functional mode, while applying selected values on the primary inputs executing one step in the circuit, forming a response based on the values on the primary inputs and in the memory elements, and observing the responses on the primary outputs, setting the memory elements into the scan mode, shifting a pattern out of the scan chain to observe the response formed in the memory elements.

The substitution of the memory elements of a circuit by respective scannable memory elements brings the advantage that the resulting circuit is a combinational circuit and that test patterns for it can be generated by a Combinational Automatic Test Pattern Generator. However scan test also involves a number of costs:

a scannable memory element requires more silicon area on the integrated circuit than an ordinary memory element, a scannable memory element requires additional wires for connection to other scannable elements and for scan control to set the scannable memory element into the scan mode, a scannable memory element has a degraded performance because of the added scan functionality, and the scan chain containing the scannable memory elements is in general quite long, even when multiple scan chains are used, and this causes a large number of test cycles for shifting patterns into and out of the scan chain.

To reduce these costs, scan test methods have been developed in which not all memory elements of the circuit are substituted by scannable memory elements, while maintaining the advantage that it is easier to generate test patterns for the modified circuit than for the original circuit. These methods are called incomplete scan or partial scan. Such a partial scan method is described in the article "The BALLAST Methodology for Structured Partial Scan Design", Rajesh Gupta, Rajiv Gupta and Melvin A. Breuer, IEEE Transactions on Computers, Vol. 39, No. 4, pp. 538–544, April 1990. In this known method, the selection as to what memory elements should be made scannable is carried out in such a way that the test patterns for the modified circuit can be generated with a Combinational Automatic Pattern Generator, while the original sequential circuit would have required a Sequential Automatic Test Pattern Generator. This is realised by selecting memory elements to be made scannable in such a way that every directed cycle of the circuit contains at least one scannable memory element. Furthermore, in this known method the memory elements that are not made scannable together with the combinational subcircuits form balanced structures for which test patterns can be generated in a relatively easy way. In the known method, test patterns are generated with a Combinational Automatic Test Pattern Generator with a fault coverage that is the same as the fault coverage that would be achieved by an ideal Sequential Automatic Test Pattern Generator for the original, unmodified circuit.

SUMMARY OF THE INVENTION

It is an object of the invention to provide a method of the kind set forth which has a better fault coverage than the known method. This object is achieved according to the invention in a method that is characterised in that the selection step further includes a selection substep for determining whether the digital circuit comprises a balanced reconvergent structure, such structure comprising at least two reconvergent paths with a mutual equal number of memory elements, and for subsequently selecting from the memory elements a further memory element to be made scannable on the basis of the balanced reconvergent structure, if present. Such reconvergent structure comprises two signal paths originating from the same source. Where the two signal paths reconverge, i.e. come together again, the signals from the respective paths cannot be independently controlled. The consequence is that these signals cannot be given any combination of values. If for the detection of a fault, the respective signals from the paths must be given a value that is not possible, then such fault is not detectable.

Now by making a memory element scannable, which gives full control over the signal values, the fault becomes detectable and the fault coverage of the method according to the invention has increased.

An embodiment of the method according to the invention is characterised in Claim 2. In such a structure, two reconvergent signal paths each comprising the same number of memory elements start from a common input and end at some common output, whereby the value at the output is determined by both signal paths. The signals at the end of the paths cannot be given any value because the signal paths originate from the same input. This means that if for the detection of a fault it is necessary to generate a combination of signal values at the end of the signal paths that is not possible, then the occurrence of such a fault cannot be detected. By making one of the memory elements in one of the two paths scannable, such a fault can be detected because the result from the paths can now be controlled individually in the test mode and the desired signal values can be generated, thus improving the fault coverage.

An embodiment of the method according to the invention is characterised in Claim 3. By limiting to structures with reconvergent signal paths that are sequentially redundant, fewer memory elements will be made scannable, while maintaining the advantage of increased fault coverage. Fewer scannable memory elements means a reduction in cost for the digital circuit and for the time of execution of the scan test because of the shorter scan chain.

An embodiment of the method according to the invention is characterised in Claim 4. The propagation of the negative effect on the fault coverage of the combinational subcircuit with reconvergent signal paths, this is the inability to pass on arbitrary signal values, is blocked by making the memory element feeding and/or the memory element fed by the combinational subcircuit scannable. This gives full control over these points and the previous and/or the subsequent subcircuits are not influenced by the combinational subcircuit. The propagation of the effect leads to the situation in which fewer possible faults in the circuit can be detected and by avoiding this propagation the fault coverage is improved.

An embodiment of the method according to the invention is characterised in Claim 5. By limiting to subcircuits with reconvergent signal paths that are redundant, fewer memory elements will be made scannable, while maintaining the advantage of increased fault coverage. Fewer scannable memory elements means a reduction in cost for the digital circuit and for the, time of execution of the scan test because of the shorter scan chains.

The object of the invention is alternatively achieved according to the invention in a method that is characterised in that the selection step further includes a selection substep for determining whether the digital circuit comprises a redundant structure and for subsequently selecting from the memory elements a further memory element to be made scannable on the basis of the redundant structure, if present. By making the relevant memory element scannable, the occurrence of certain group of faults, which would otherwise remain undetected because of masking through the redundancy, can now be detected. This results in a method with a better fault coverage than the known method. The redundancy in the digital circuit causes that the logic behaviour of the digital circuit remains correct even while a specific one of the certain group occurs. Despite the correct logic behaviour of the digital circuit, it is important to detect such an error in view of the quality of the manufacturing process and the manufactured product. Such occurring error may be the result of a flaw in the manufacturing process which is important to detect so that the process can be controlled back to its normal operation. Also, such occurring error may cause undesired effects in the digital circuit, e.g. a large leaking current. The digital circuit will have a correct logical behaviour, but is of low quality.

Further advantageous embodiments of the invention are recited in dependent claims.

BRIEF DESCRIPTION OF THE DRAWINGS

The invention and its attendant advantages will be further elucidated with the aid of exemplary embodiments and the accompanying schematic drawings, whereby.

Corresponding features in the various Figures are denoted by the same reference symbols.

DESCRIPTION OF THE PREFERRED EMBODIMENTS

Figure 1:
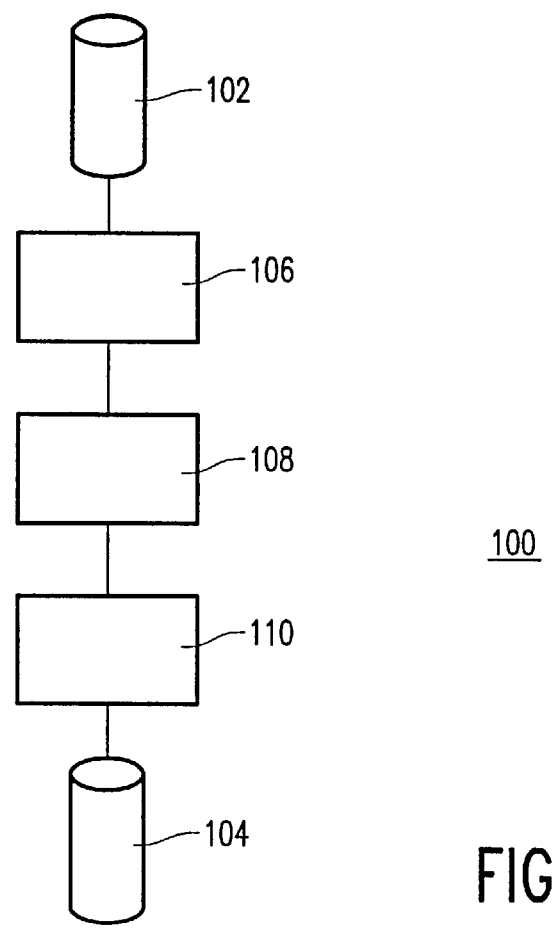
FIG. 1 schematically shows an overview of the method according to the invention.

FIG. 1 schematically shows an overview of the method according to the invention. The method 100 uses a representation of a digital circuit 102 as input and transforms this in a number of steps into a representation 104. The latter representation is used as basis for the later manufacture of the digital circuit. The representation 102 is usually produced by synthesis software or similar program and is electronically available in a suitable format. The representation 102 is modified in the various steps in order to make the later manufactured circuit testable via the scan test method. For the sake of ease of terminology, references to the representation of the digital circuit and to its constituents parts are in the context of this document presented as references to the circuit and the parts themselves.

The digital circuit 102 comprises a number of memory elements, for instance flip flops or latches, and a number of combinational subcircuits connected to the memory elements. The method 100 modifies the circuit in order to allow a so-called partial scan test on the manufactured circuit and includes a step 106 for selecting the memory elements that are to be made scannable. These selected memory elements are replaced by scannable, but further equivalent, memory elements in step 108. The scannable memory elements are connected together in one or more scan chains in step 110. In the later test pattern generation, the memory elements that are not made scannable are treated as simple delayless buffers. The organisation of the method into various steps is shown in order to explain the principle of the invention. An actual program implementing the method may combine certain steps and may need detailed substeps not shown in FIG. 1.

Figure 2:
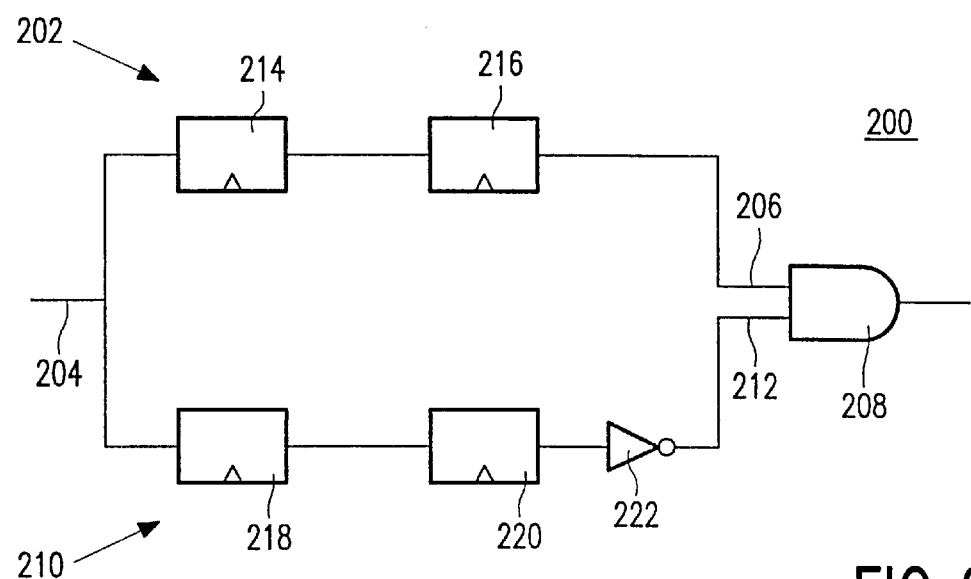
FIG. 2 shows an example of a sequentially redundant structure.

FIG. 2 shows an example of a sequentially redundant structure. A path 202 starts from an input 204 of the structure and ends at input 206 of AND-gate 208. A path 210 also starts from input 204 and ends at input 212 of the AND-gate 208. Path 202 contains memory elements 214 and 216 and path 210 contains memory elements 218 and 220 and an invertor 222. Both paths contain the same number of subsequent memory elements, in this example 2, and are therefore not independent in their operation. The result is here that not all combinations of '0' and '1' can be applied to the inputs of the AND-gate 208. The truth table related to FIG. 2 is:

| 206 | 212 | 204 |
|-----|-----|-----|
| (t = 2) | | (t = 0) |
| 0 | 0 | ? |
| 0 | 1 | 0 |
| 1 | 0 | 1 |
| 1 | 1 | ? |

The combination with two '0'-s and the combination with two '1'-s cannot be realised. Faults for whose detection one of these combination is necessary, cannot be detected. Now, according to the invention one of the memory elements in one of the paths is selected and replaced by a scannable memory element. In scan test, the respective path is then under direct control via the scan chain and the two paths are no longer dependent in their operation. Every desired value can be generated on the inputs of the AND-gate and the previously undetectable faults can now be detected.

A sequentially redundant structure in general causes the problem that it is not possible to fully control the signal values at each point in the circuit. This means that not all possible faults can be detected during a scan test. The method according to the invention determines whether the digital circuit comprises a sequentially redundant structure of the kind as shown in FIG. 2. If such structure is present, one of the memory elements in one of the mutually redundant paths is made scannable. The result is that more faults can be detected, thus increasing the fault coverage of the scan test.

Figure 3:
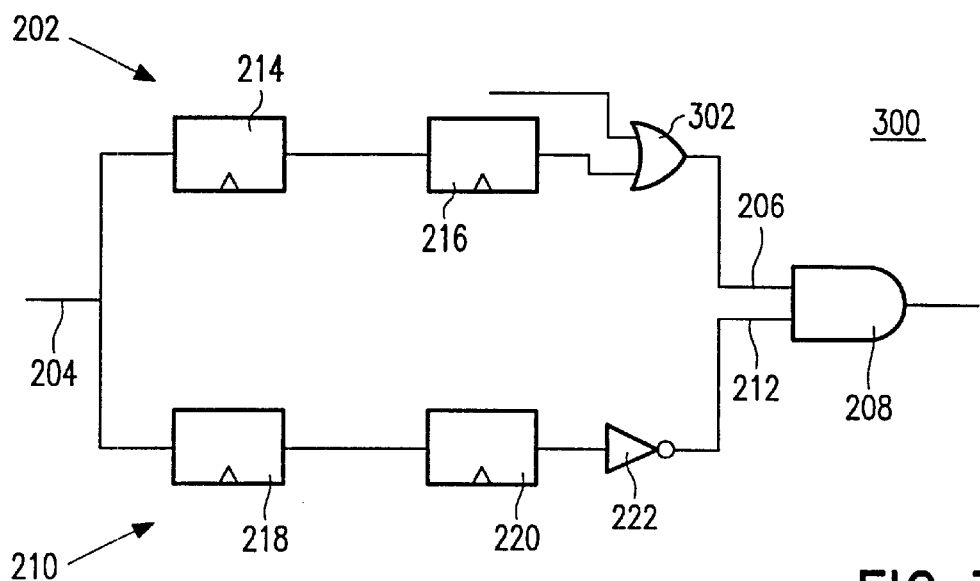
FIG. 3 shows an example of a structure with two reconvergent signal paths which is not redundant.

Determining whether a structure is truly redundant requires a large computational effort. In an embodiment of the invention, there is no search for truly sequentially redundant structures but for structures comprising reconvergent signal paths. This is a structure in which two signal paths start from a common input and at a further location come together in a common output. If such a structure is found and if its paths have the same number of consecutive memory elements, then this structure is treated as if it concerned a sequentially redundant structure and one of the memory elements is made scannable. The result of the search for these structures with reconvergent signal paths is the collection of all such structures that are redundant and potentially some structures that are not redundant. FIG. 3 shows an example of a structure with two reconvergent signal paths which is not redundant. This structure is the same as structure 200 of FIG. 2, but path 202 now contains an OR-gate 302 which receives at one of its inputs a signal from another part of the digital circuit. This means that both signal paths can operate independent from each other and that the structure is not sequentially redundant. In this particular embodiment, one of the memory elements is made scannable although this is not strictly necessary and gives no increase of the fault coverage. This is the price that is paid for the more simple and easy search for reconvergent structures instead of the more complicated and time-consuming search for sequentially redundant structures. In practice it has been found that for many types of digital circuits, the more simple search gained a lot of search time, while only a few memory elements were unnecessarily made scannable.

Figure 4:
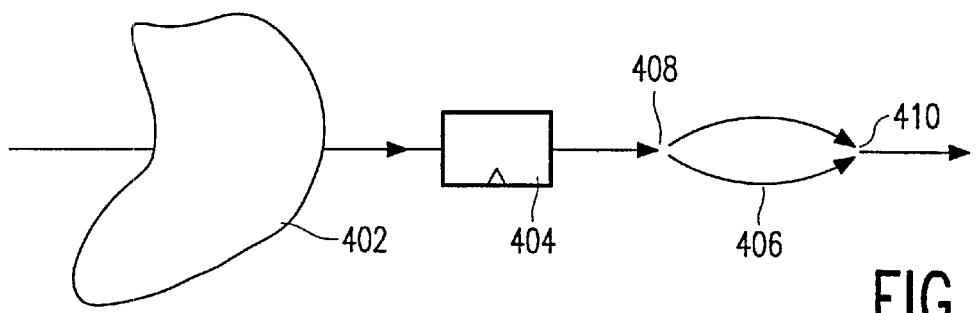
FIG. 4 shows a part of a digital circuit with a combinational redundant subcircuit.

FIG. 4 shows a part of a digital circuit with a combinational redundant subcircuit. The digital circuit comprises a first combinational subcircuit 402 feeding its signals via memory element 404 to a second combinational subcircuit 406. In this example, subcircuit 406 concerns a redundant subcircuit, symbolised by the two reconvergent arrows. In contrast to the redundant structure of FIG. 2, the redundant subcircuit 406 does not contain any memory element and its redundancy cannot be removed by making some memory element scannable. The redundancy may cause the situation that the subcircuit cannot pass on each signal value from its input 408 to its output 410. See FIG. 6 for simple examples of such a situation. If during scan test a response is generated by subcircuit 402 in memory element 404, and this response cannot be passed on by subcircuit 406 due to its redundancy, then the presence of a fault in subcircuit 402 may be masked. So the effect of the redundancy of subcircuit 402, which cannot be remedied, is not restricted to that subcircuit but is propagated to the preceding subcircuit 402. Now according to an embodiment of the invention, this problem of propagation is solved by making the memory element 404 scannable. Then the response of subcircuit 402 is captured in the scan chain and can be observed externally by shifting it out of the scan chain. Faults in subcircuit 402 that were previously undetectable can now be detected and the fault coverage of the scan test has been increased.

To determine whether a combinational subcircuit is redundant requires a relatively large computational effort. Therefore, for similar reasons as described above, in an embodiment of the invention it is determined whether the digital circuit comprises a combinational subcircuit with reconvergent signal paths from a common input to a common output. If such a subcircuit with reconvergent signal paths is found, this subcircuit is treated as a redundant subcircuit and a preceding memory element, if present, is selected to be made scannable. Occasionally such subcircuit is not redundant and the respective memory element is made scannable while this was not necessary. However, the advantage of shorter search times for the more simple search for reconvergent signal paths outweighs the cost of the few extra substitutions of a memory elements by a scannable memory elements.

Figure 5:
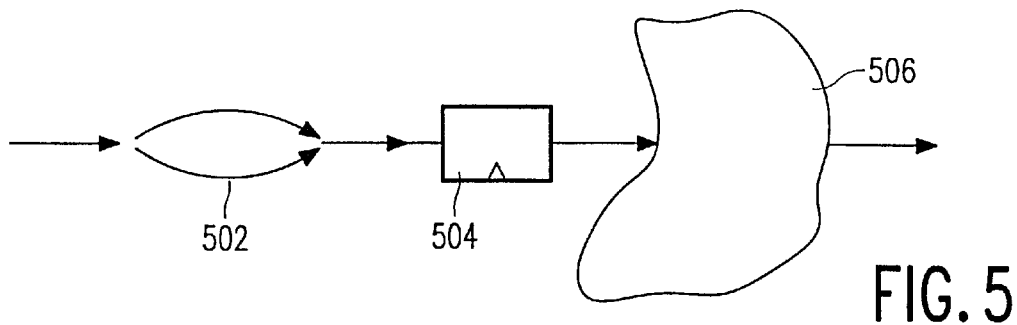
FIG. 5 shows another example of a part of a digital circuit with a combinational redundant subcircuit.

FIG. 5 shows another example of a part of a digital circuit with a combinational redundant subcircuit. This example is similar to the one of FIG. 4 but now the redundant combinational subcircuit 502 feeds via memory element 504 another subcircuit 506. If for the detection of a certain fault in subcircuit 506 a signal value is required that cannot be passed on via the redundant subcircuit 502, then such fault cannot be detected. This is solved by making the memory element 504 scannable, which gives the possibility to shift in the required signal value via the scan chain. Then such fault becomes detectable and the fault coverage has been increased. Similarly as described above, instead of searching for redundant combinational subcircuits searching can be done for combinational subcircuits with two reconvergent signal paths.

Figure 6:
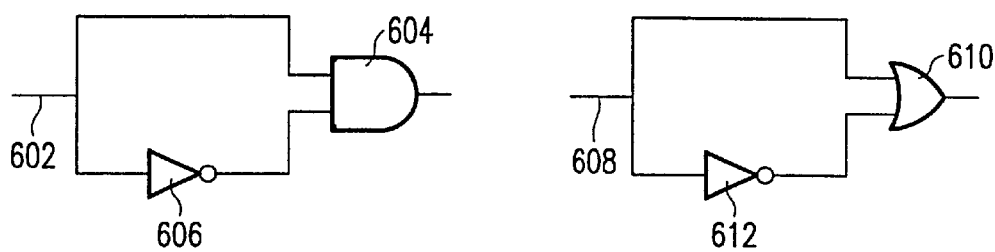
FIG. 6 shows two examples of a combinational redundant subcircuit.

FIG. 6 shows two examples of a combinational redundant subcircuit. In the first example, two signal paths start from input 602 and end at respective inputs of AND-gate 604. One of the signal paths includes an invertor 606. The output of the AND-gate 604 will always be '0', whether input 602 receives a '0' or '1'. In the second example, two signal paths start from input 608 and end at respective input of OR-gate 610. One of the signal paths includes and invertor 612. The output of the OR-gate 610 will always be '1', S whether input 608 receives a '0' or '1'. These examples are very simple for ease of illustration of the principle but in practice far more complicated redundant subcircuits exist.

In an embodiment of the invention, the digital circuit is searched for directed feedback cycles with a memory element. The selection step then selects memory elements to be made scannable in such a way that every feedback cycle contains at least one scannable memory element. For the purpose of scan test, the feedback is then removed from the digital circuit and the test patterns for the circuit can be generated with a Combinational Pattern Generator.

Figure 7:
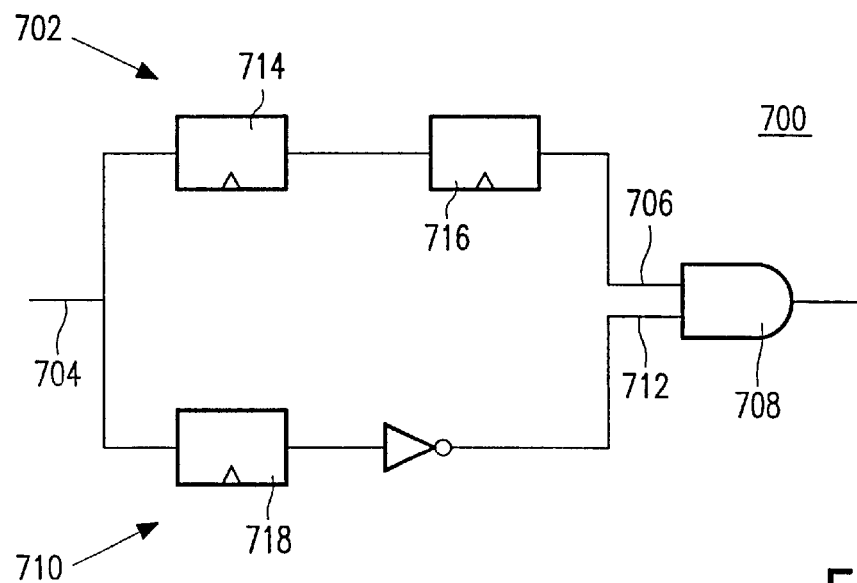
FIG. 7 shows an example of an unbalanced reconvergent structure.

FIG. 7 shows an example of an unbalanced reconvergent structure. A path 702 starts from an input 704 of the structure and ends at input 706 of AND-gate 708. A path 710 also starts from input 704 and ends at input 712 of the AND-gate 708. Path 702 contains memory elements 714 and 716 and path 710 contains memory element 716. The difference with structure 200 of FIG. 2 is that the two paths do not contain the same number of subsequent memory elements and are therefore independent in their operation. The result is here that all combinations of '0' and '1' can be applied to the inputs of the AND-gate 708. The truth table related to FIG. 7 is:

| 706 (t = 2) | 712 (t = 0) | 704 (t = 1) |
| --- | --- | --- |
| 0 | 0 | 0 | 1 |
| 0 | 1 | 0 | 0 |
| 1 | 0 | 1 | 1 |
| 1 | 1 | 1 | 0 |

So it does not seem necessary to replace a memory element of structure 700 by a scannable memory element. As described earlier, memory elements that are not made scannable are for the remainder of the scan test procedure treated as simple delayless buffers. When the memory elements are substituted by such a buffer, structure 700 becomes a combinational redundant structure. This means that certain faults cannot longer be detected. In order to avoid this problem, one of the memory elements is made scannable and this removes the redundancy. So in an embodiment of the invention it is determined whether the digital circuit comprises an unbalanced reconvergent structure and if this is the case then a memory element of this structure is replaced by a scannable memory element.

Redundancy in a digital circuit may be due to the usage of tools for developing the circuit. In complex situation tools may not be able to recognise a redundant structure and to remove such a structure. So in practice, complex digital circuits comprise an amount of redundancy and the method according to the invention improves the fault coverage for the scan test of such circuits.

What is claimed is:

1. A method for modifying a representation of a digital circuit in order to allow a scan test, the digital circuit having one or more combinational subcircuits, having one or more memory elements, and having circuit structures with reconvergent signal paths including sequentially redundant structures, the method comprising:

searching the digital circuit for each reconvergent structure that has at least two reconvergent paths with a mutual equal number of memory elements, the searching including the reconvergent structures that are sequentially redundant and not excluding at least one structure that is not sequentially redundant;

for each reconvergent structure found in the digital circuit, subsequently selecting from the memory elements of said each reconvergent structure one of the memory elements to be made scannable;

replacing the selected memory elements by respective scannable memory elements; and connecting the scannable memory elements into one or more scan chains.

2. A method as claimed in claim 1, wherein subsequently selecting from the memory elements includes determining whether the circuit comprises two mutually balanced reconvergent signal paths from an input of a balanced reconvergent structure to an output of the balanced reconvergent structure and subsequently selecting from the memory elements a further memory element to be made scannable.

3. A method as claimed in claim 1, wherein subsequently selecting from the memory elements includes determining whether the digital circuit comprises a combinational subcircuit with two reconvergent signal paths from an input of the combinational subcircuit to an output of the combinational subcircuit, and subsequently selecting from the memory elements connected to the combinational subcircuit a further memory element to be made scannable.

4. A method as claimed in claim 3, wherein the combinational subcircuit is redundant.

5. A method as claimed in claim 3, wherein the reconvergent structures found in the digital circuit include at least one structure that is not sequentially redundant and wherein the combinational subcircuit is not redundant.

6. A method as claimed in claim 3, wherein the further memory element subsequently selected to be made scannable is a memory element that feeds the combinational subcircuit with the two reconvergent signal paths.

7. A method as claimed in claim 3, wherein the further memory element subsequently selected to be made scannable is a memory element that is fed by the combinational subcircuit with the two reconvergent signal paths.

8. A method as claimed in claim 1, further including searching the digital circuit for directed feedback cycles within a memory element, and wherein the selection of memory elements to be made scannable includes modifying each found feedback cycle to contain at least one scannable memory element.

9. A method for modifying a representation of a digital circuit in order to allow a scan test, the digital circuit having one or more combinational subcircuits, having one or more memory elements, and having circuit structures with reconvergent signal paths including sequentially redundant structures, the method comprising:

searching the digital circuit for each reconvergent structure that has at least two reconvergent paths with a mutual equal number of memory elements, the searching including the reconvergent structures that are sequentially redundant and not excluding at least one structure that is not sequentially redundant;

for each reconvergent structure found in the digital circuit, subsequently selecting from the memory elements of said each reconvergent structure one of the memory elements to be made scannable;

determining whether the digital circuit comprises a combinational subcircuit with two reconvergent signal paths from an input of the combinational subcircuit to an output of the combinational subcircuit, and subsequently selecting from the memory elements connected to the combinational subcircuit a further memory element to be made scannable, the further memory element being immediately adjacent the combinational subcircuit;

replacing the selected memory elements by respective scannable memory elements; and connecting the scannable memory elements into one or more scan chains.

10. A method as claimed in claim 9, wherein the reconvergent structures found in the digital circuit include at least one structure that is not sequentially redundant and wherein the further memory element subsequently selected to be made scannable does not enhance the scan test.

11. A method as claimed in claim 10, further including searching the digital circuit for directed feedback cycles within a memory element, and wherein the selection of memory elements to be made scannable includes modifying every feedback cycle to contain at least one scannable memory element.

12. A method as claimed in claim 9, further including searching the digital circuit for directed feedback cycles within a memory element, and wherein the selection of memory elements to be made scannable includes modifying each found feedback cycle to contain at least one scannable memory element.

* * * * *